(12) United States Patent
Korger et al.

(10) Patent No.: US 7,028,238 B2
(45) Date of Patent: Apr. 11, 2006

(54) INPUT/OUTPUT CHARACTERIZATION CHAIN FOR AN INTEGRATED CIRCUIT

(75) Inventors: Peter Korger, Frederick, CO (US); Brian Schoner, Freemont, CA (US)

(73) Assignee: LSI Logic Corporation, Milpitas, CA (US)

( * ) Notice: Subject to any disclaimer, the term of this patent is extended or adjusted under 35 U.S.C. 154(b) by 448 days.

(21) Appl. No.: 10/125,675

(22) Filed: Apr. 18, 2002

(65) Prior Publication Data

US 2003/0200045 A1    Oct. 23, 2003

(51) Int. Cl.
*G01R 31/28* (2006.01)

(52) U.S. Cl. ...................................... 714/727
(58) Field of Classification Search ................ 714/724, 714/726, 727, 729, 732, 733; 326/16, 40; 327/202
See application file for complete search history.

(56) References Cited

U.S. PATENT DOCUMENTS

| 4,740,970 A | * | 4/1988 | Burrows et al. ............. 714/733 |
| 5,859,860 A | * | 1/1999 | Whetsel ....................... 714/727 |
| 6,629,275 B1 | * | 9/2003 | Pendurkar et al. .......... 714/726 |
| 6,651,200 B1 | * | 11/2003 | Barahmand et al. ........ 714/731 |

FOREIGN PATENT DOCUMENTS

| EP | 0 402 134 A2 | 6/1990 |
| EP | 1 357 388 A3 | 3/2004 |

OTHER PUBLICATIONS

Jungert H et al: "Standardmassiges Testen Komplexer Systeme" Elektronik, Franzis Verlag GMBH. Munchen, DE. vol. 38, No. 14, Jul. 7, 1989, pp. 96-103, XP000030414.
Waunder C et al: "Boundary Scan A Framework for Structured Design-for-Test" Integration of Test with Design and Manufactring. Washington, Sep. 1-3, 1987, Proceedings of the International Test Conference, Washington, IEEE Comp. Soc. Press, IS.

* cited by examiner

*Primary Examiner*—Albert Decady
*Assistant Examiner*—James C. Kerveros
(74) *Attorney, Agent, or Firm*—Westman, Champlin & Kelly (57) ABSTRACT

An input/output characterization register is provided for characterizing an integrated circuit input or output. The register includes a normal data input, a characterization data input, and a data latch having a latch control input, a latch data input and a latch data output. The normal data input and the characterization data input are multiplexed with the latch data output to the latch data input.

14 Claims, 4 Drawing Sheets

INPUT/OUTPUT CHARACTERIZATION CHAIN FOR AN INTEGRATED CIRCUIT

FIELD OF THE INVENTION

The present invention relates to integrated circuits and, more specifically to methodologies for characterizing set up and hold times for the input and output pins of an integrated circuit.

BACKGROUND OF THE INVENTION

Once a semiconductor integrated circuit has been fabricated, the circuit is often tested to identify potential faults in the circuit. One type of test is known as input/output (I/O) characterization. During I/O characterization, the set up and hold times for each input of the integrated circuit and the minimum and maximum delays for each output of the integrated circuit are measured for all possible transitions on those inputs and outputs. The measured values are then compared to pre-determined specifications.

One method of performing I/O characterization is to couple the integrated circuit die to a tester which applies a series of patterns to the inputs of the integrated circuit that are selected to create each transition on each pin. However, generating all the possible transitions on the inputs and the outputs of a die running in a normal operating mode is often not a trivial task. In order to characterize an input or an output, the tester must be able to control that input or output and must be able to observe it. For a typical integrated circuit, it takes the test engineer a large amount of time to create the test patterns that are capable of generating all possible transitions on each input and output. Also, the test itself often consumes a large amount of tester time, which is expensive. Generating all possible transitions on each input and output can take a large number of clock cycles to accomplish.

Addition factors often further complicate I/O characterization. The integrated circuit cores that are being tested often do not come with a characterization plan. If the test engineer is not familiar with a particular design, it can be difficult to create a set of test patterns that control and observe the pins. Also as integrated circuit designs get larger, a particular signal may need to pass through many modules within the integrated circuit before it can be observed on an output pin. Some integrated circuit designs include ports that run asynchronously to the rest of the chip. These ports are extremely difficult to characterize. In addition, some integrate circuit designs are inherently difficult to characterize.

Improved I/O characterization methodologies are desired, which allow all possible transitions on each input and output to be created and observed more easily for measuring the input set up and hold values and the output minimum and maximum delay values in an automated way without requiring prior knowledge about the details of the design.

SUMMARY OF THE INVENTION

One embodiment of the present invention is directed to an input/output characterization register for characterizing an integrated circuit input or output. The register includes a normal data input, a characterization data input, and a data latch having a latch control input, a latch data input and a latch data output. The normal data input and the characterization data input are multiplexed with the latch data output to the latch data input.

Another embodiment of the present invention is directed to an output characterization circuit for characterizing an integrated circuit output. The output characterization circuit includes an output pin, a logic circuit, and a plurality of output characterization registers. Each register includes a normal data input, a characterization data input, and a data latch. The data latch has a latch control input, a latch data input and a latch data output which drives the output pin through the first logic circuit. Within each register, the normal data input and the characterization data input are multiplexed with the latch data output to the latch data input. The plurality of registers are coupled in a chain, with the latch data output of each register being coupled to the characterization data input of the next register in the chain.

Another embodiment of the present invention is directed to an input characterization circuit for characterizing inputs to an integrated circuit. The input characterization circuit includes a plurality of input pins, a logic circuit, and a input characterization register. The input characterization register includes a normal data input, which is driven by the first plurality of input pins through the logic circuit, a characterization data input, and a data latch. The data latch has a latch control input, a latch data input and a latch data output. The normal data input and the characterization data input are multiplexed with the latch data output to the latch data input.

DETAILED DESCRIPTION OF ILLUSTRATIVE EMBODIMENTS

Figure 1:
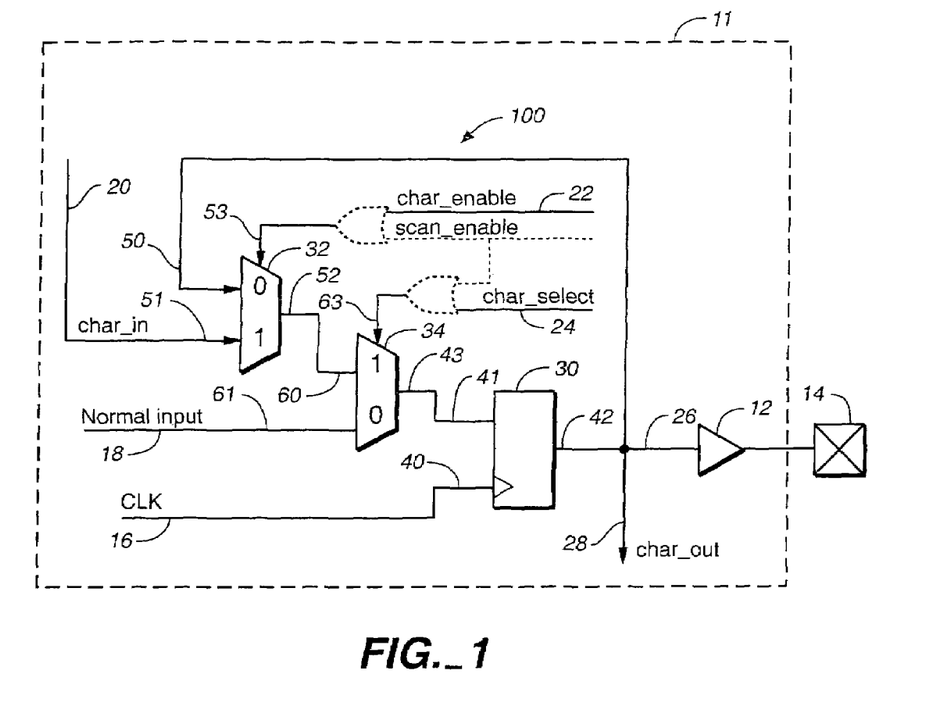
FIG. 1 is a schematic diagram of an input/output (I/O) characterization register according to one embodiment of the present invention.

FIG. 1 is a schematic diagram of an input/output (I/O) characterization register that can be used to build test structures within an integrated circuit design for input/output ("I/O") characterization, according to one embodiment of the present invention. During I/O characterization, the set up and hold times for each input and the minimum and maximum delays for each output are measured for each possible transition. For example, a bi-directional I/O pin must be characterized for L-Z, H-Z, Z-L, Z-H, H-L and L-H transitions, where "L" is a logic low level, "H" is a logic high level and "Z" is a high impedance state. The I/O characterization register shown in FIG. 1 can be substituted for any normal input register, which is driven from a logic cone from an input pin, or output register, which drives an output pin through a logic cone, in an integrated circuit design to add controllability and observability to the inputs and outputs without significantly distorting the I/O path delays. No additional registers need to be added to the design. If the integrated circuit design is already configured with "scanable" registers for scan testing, then these scanable registers can be replaced with I/O characterization registers without adding any delay to the I/O data paths since the multiplexers placed in the data paths for scan testing can be shared with those used for I/O configuration.

In the example shown in FIG. 1, I/O characterization register 10 is used as an output register on an integrated circuit 11 for driving an output buffer 12 and an output pin 14. Register 10 includes a clock input 16 (labeled "CLK"), a normal data input 18 (labeled "NORMAL_INPUT"), a characterization data input 20 (labeled "CHAR_IN"), a characterization shift enable input 22 (labeled "CHAR_EN-ABLE"), a characterization select input 24 (labeled "CHR_SELECT"), a data output 26 and a characterization data output 28 (labeled "CHAR_OUT"). I/O characterization register 10 further includes an internal data latch 30 and internal multiplexers 32 and 34.

Data latch 30 has a latch control input 40, a latch data input 41 and a latch data output 42. In one embodiment, data latch 30 includes a D-type flip-flop. However, any other suitable latch circuit can also be used. Latch control input 40 is coupled to clock input 16. Latch data input 41 is coupled to output 43 of multiplexer 34. Latch data output 42 is coupled to data output 26 and characterization data output 28. Data output 26 is coupled to the input of output buffer 12, which drives output pin 14.

Multiplexer 32 includes data inputs 50 and 51, data output 52 and control (or "select") input 53. Data input 50 is coupled to latch data output 42, and data input 51 is coupled to characterization data input 20. Data output 52 is coupled to data input 60 of multiplexer 34. Control input 53 is coupled to characterization shift enable input 22. Multiplexer 32 therefore shifts in new data from characterization data input 20 or feeds back old data from latch data output 42 to the input of multiplexer 34 as a function of the logic level on characterization shift enable input 22. The output of multiplexer 32 can be referred to as a "characterization data node."

Similarly, multiplexer 34 includes data inputs 60 and 61, data output 43 and control (or "select") input 63. Data input 61 is coupled to normal data input 18 of register 10. Data output 43 is coupled to latch data input 41. Control input 63 is coupled to characterization select input 24. Multiplexer 34 couples either the characterization data from multiplexer 32 or normal data from normal data input 18 to latch 30 as a function of the logic level on characterization select input 24.

In an actual implementation, register 10 would be one of a plurality of similar registers that are connected together to form a "characterization chain", wherein the characterization data output 28 of one register is coupled to the characterization data input 20 of the next register in the chain. The characterization data input 20 of the first register in the chain and the characterization data output 28 of the last register in the chain would be coupled to control circuitry located either on integrated circuit 11 or external to integrated circuit 11. Each characterization register 10 in the chain would be substituted for a traditional output register in the design to allow greater control and observability of each of the output pins 14.

Characterization register 10 has the following three modes of operation:

| MODE | CHAR_SELECT | CHAR_ENABLE |
|---|---|---|
| Normal operation | 0 | X |
| Shift chain | 1 | 1 |
| Hold value | 1 | 0 | where "0" represents to a logic low level, "1" represents to a logic high level and "X" represents a "don't-care condition".

During normal operation, CHAR_SELECT is "0" which causes multiplexer 34 to couple the data on normal data input 18 to data latch 30. Normal data input 18 would be coupled to internal logic for implementing the normal function of integrated circuit 11. In this mode, I/O characterization register 10 operates as a normal output register for driving output pin 14. The introduction of multiplexer 34 to the normal output data path adds very little additional delay to data input 41 of latch 30. However if integrated circuit 11 is already configured with scanable registers, then there would be no additional delay to data input 41. Multiplexer 34 can be shared between scan testing and I/O configuration. For example, register 10 can be modified to perform both scan testing and I/O configuration by using the characterization chain as a scan chain. Scan control can be added by presenting a logical OR (shown in phantom) of CHAR_ENABLE and a similar scan enable SCAN_ENABLE to multiplexer select input 53 and by presenting a logical OR (shown in phantom) of CHAR_SELECT and SCAN_ENABLE to multiplexer select input 63. Thus, no additional circuit elements would be added to the data path between normal input 18 and data input 41 of latch 30, as compared to a design having scanable flip-flops since multiplexer 34 can be shared between scan testing and I/O characterization.

In the shift chain mode, a pattern of data values or successive patterns of data values can be shifted into the characterization registers within the chain for forcing particular transitions on the output pins. In this mode, multiplexer 32 couples the data values on characterization data input 20 to input 60 of multiplexer 34, and multiplexer 34 couples the values to latch 30. As the patterns are shifted into data latches 30, an external tester can monitor the transitions on the output pins.

In the hold value mode, multiplexers 32 and 34 feed the value on latch data output 42 back to latch data input 41 such that data latch 30 holds its value during subsequent clock cycles. For example, I/O characterization registers in one characterization chain can be used to hold selected values during a test of another characterization chain, even when both chains are clocked by the same clock signal.

Every type of input and output of an integrated circuit can be added to a characterization chain such as that shown in FIG. 1 to add controllability and/or observability to that input or output In a particular integrated circuit, there can be several characterization chains for inputs, outputs and multiple clock domains. These chains can be independent from one another or can be intertwined. For example, each chain can have its own set of characterization select and characterization enable inputs or these inputs can be shared between chains if separate control is not required. If characterization chains are consistently applied to an entire integrated circuit, the task of creating test patterns for toggling each input and output pin and observing the resulting delays becomes very easy and can be automated.

Figure 2:
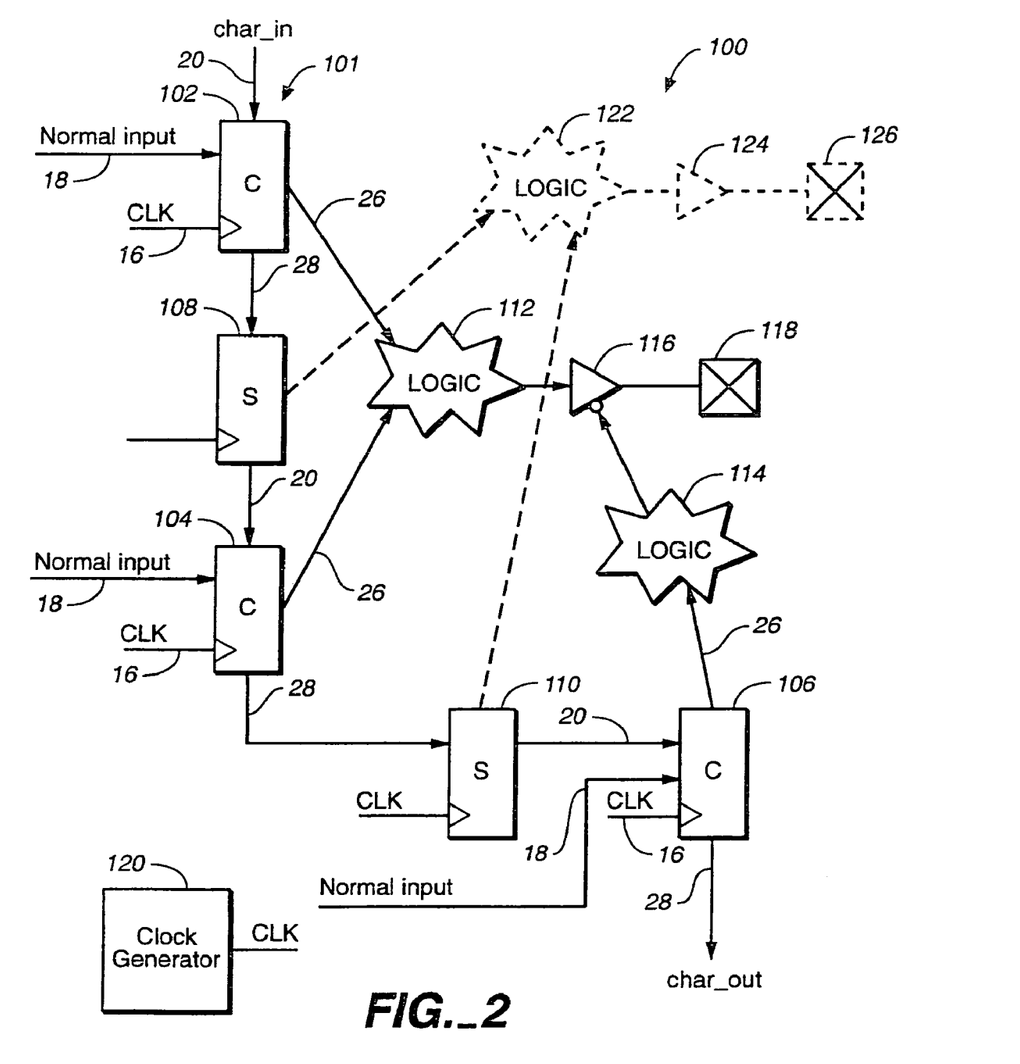
FIG. 2 is a schematic diagram illustrating a portion of an integrated circuit having an output characterization chain according to one embodiment of the present invention.

FIG. 2 is a schematic diagram illustrating an example of an output characterization chain in greater detail according to one embodiment of the present invention. Integrated circuit 100 includes a characterization chain 101 formed by output characterization registers 102, 104 and 106 and spacing registers 108 and 110. Integrated circuit 100 further includes logic circuits 112 and 114, tri-state output buffer 116 and output pin 118. In one embodiment of the present invention, each output register that drives output pin 118 is configured as an output configuration register similar to register 10 shown in FIG. 1. The set of registers that drives output pin 118 is known as an "output group". Each output register can be a part of one or more output groups.

Since each of the output characterization registers 102, 104 and 106 is similar to register 10 shown in FIG. 1, the same reference numerals are used for their inputs and outputs as were used for register 10 in FIG. 1. For simplicity, the characterization shift enable input 22 and the characterization enable input 24 of each register is not shown in FIG. 2.

The normal data inputs 18 of characterization registers 102, 104 and 106 are coupled to internal logic (not shown) of integrated circuit 100 for performing the normal logic function of the circuit. Clock inputs 16 are coupled to clock signal CLK, which is provided by clock generator 120. Clock generator 120 can be internal or external to integrated circuit 100.

Logic circuit 112 is driven by data outputs 26 of output characterization registers 102 and 104, and logic circuit 114 is driven by data output 26 of output characterization register 106. The output of logic 114 is coupled to the data input of tri-state output buffer 116. The output of logic 114 is coupled to the tri-state control input of output buffer 116. The output of buffer 116 is coupled to output pin 118.

The characterization data output 28 of each output characterization register 102, 104 and 106 is coupled to the characterization data input 20 of the next successive output characterization register in chain 101. Spacing registers 108 and 110 are coupled between each of the output characterization registers 102, 104 and 106 along chain 101. The data input of each spacing register 108 and 110 is coupled to the characterization data output 28 of the next preceding output characterization register in chain 101. The data output of each spacing register 108 and 110 is coupled to the characterization data input of the next subsequent output characterization register in chain 101.

Spacing registers 108 and 110 are inserted to prevent consecutive output characterization registers within a particular output group. This potentially allows chain 101 to test every possible transition from a first pattern in registers 102, 104 and 106 to a second pattern in these registers. For example, it is possible to test the transition from pattern "000" to "111" in registers 102, 104 and 106. Without spacing registers 108 and 110, this transition is not possible from one clock cycle to the next. As the transitions are tested, the minimum and maximum delays from registers 102, 104 and 106 to pin 118 can be measured by the external tester. These measurements can then be compared to predetermined specifications for the integrated circuit. Each output pin in the integrated circuit can be tested in similar fashion.

To save area and power on integrated circuit 100, the spacing registers from one output group can be used as input or output characterization registers for another input or output group. The only constraint is that it is preferable for the characterization registers in each output group to alternate with suitable spacing registers. For example, spacing registers 108 and 110 can be used as characterization registers for an output group driving logic circuit 122, output buffer 124 and output pin 126 (all shown in phantom). In this embodiment spacing registers 108 and 110 would be similar to register 10 shown in FIG. 1. Each would have a characterization data input coupled to the characterization output of the preceding register in chain 101, a characterization data output coupled to the characterization input of the subsequent register in chain 101, and a normal data input (not shown) coupled to internal logic within integrated circuit 100. In another alternative embodiment, spacing registers 108 and 110 are formed of basic D-type, flip-flops.

Figure 3:
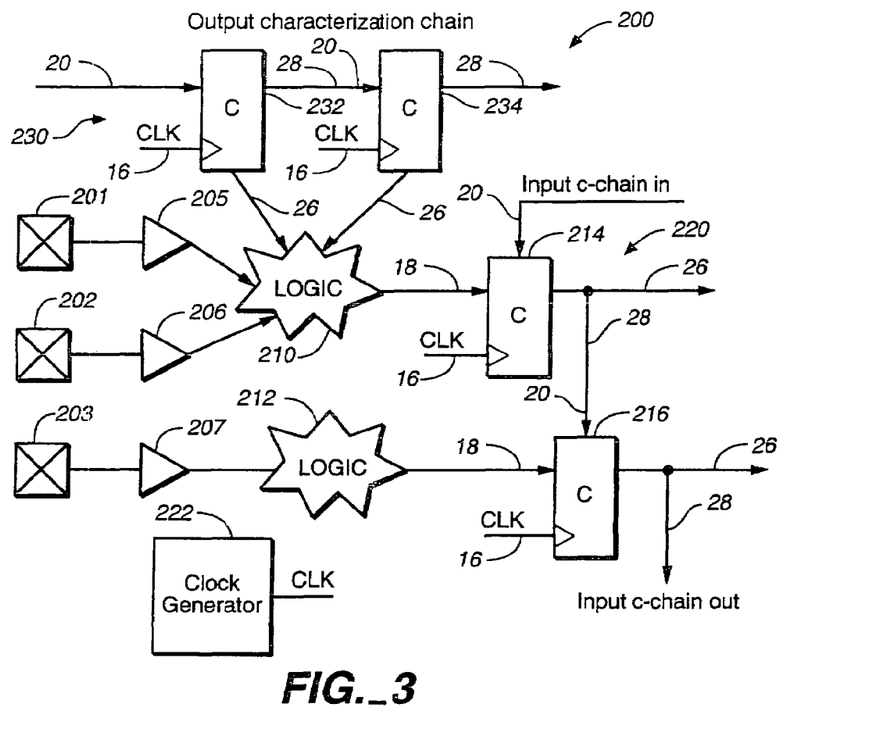
FIG. 3 is a schematic diagram illustrating a portion of an integrated circuit having an internally-clocked input characterization chain according to another embodiment of the present invention.

FIG. 3 is a schematic diagram of an integrated circuit having an input characterization chain according to one embodiment of the present invention. Integrated circuit 200 includes input pins 201, 202 and 203, input buffers 205, 206 and 207, logic circuits 210 and 212 and input characterization registers 214 and 216. Registers 214 and 216 are similar to register 10 shown in FIG. 1, and the same reference numerals are used to indicate the same or similar inputs and outputs. The normal data input 18 of register 214 is driven by input pins 201 and 202 through input buffers 205 and 206, respectively, and logic circuit 210. Similarly, the normal data input 18 of register 216 is driven by input pin 203 through input buffer 207 and logic 212. Registers 214 and 216 are coupled together to form an input characterization chain 220, with the characterization data output 28 of register 214 being coupled to the characterization data input 20 of register 216. Clock inputs 16 of registers 214 and 216 are coupled to clock signal CLK provided by clock generator 222.

Although not shown in FIG. 3, registers 214 and 216 each further include a characterization shift enable input and a characterization select input similar to inputs 22 and 24 shown in FIG. 1. Each input 22 is coupled to the other inputs 22 within characterization chain 22. Similarly, each input 24 in chain 220 is coupled to the other inputs 24 in the chain, and inputs 22 and 24 are controlled by suitable control circuitry either on-chip or off-chip.

Input characterization registers 214 and 216 have the following three modes of operation:

| MODE | CHR_SELECT | CHAR_ENABLE |
| --- | --- | --- |
| Normal operation | 0 | X |
| Shift chain | 1 | 1 |
| Latch value | 1 | 0 |

In the normal operation mode, the data values provided at the output of logic circuits 210 and 212 are latched within registers 214 and 216 at the next edge of CLK, and these values are presented to data outputs 26. In this mode, registers 214 and 216 act as normal input registers. In the shift chain mode, the data values presented to characterization data inputs 20 of each register 214 and 216 are latched at the next edge of CLK and presented to data outputs 26. The shift chain mode can be used for shifting latched values into or out of the chain. In the latch value mode, the data values on outputs 26 are fed back into the internal data latches of registers 214 and 216 such that the data values on outputs 26 stay the same for the next clock cycle. The latch value mode can be used to hold selected values in one characterization chain during a test of another characterization chain.

Input characterization chain 220 allows an external tester to measure the set up and hold times for the input pins that drive the registers in chain 220. For example, the tester can measure how much time in advance an input pin must be toggled so the new logic state on the pin is captured by the respective input characterization register on the next clock edge. This test can be performed for every possible transition on each pin. The tester applies a sequence of test patterns to the input pins and, after each transition, the input characterization registers are clocked and the resulting values stored in the registers are serially shifted out of chain 220. In one embodiment, every flip-flop on integrated circuit 200 that has a direct path from a primary input to the data-input of an input register is configured as an input characterization register.

Integrated circuit 200 can further include one or more output characterization chains 230. In the example, shown in FIG. 3, output characterization chain 230 includes output characterization registers 232 and 234 having data outputs 26, which drive a portion of logic circuit 210. Output chain 230 is independent of input chain 220. Therefore, output chain 230 can be used in the latch value mode to set and hold the states of registers 232 and 234, if desired, before the input values are latched in input chain 220. If integrated circuit 200 includes bi-directional pins, these bi-directional pins require separate testing of inputs and outputs. Therefore, a single test cannot measure the delays for both inputs and outputs, and output chain 230 would be free for use during input tests. This flexibility further simplifies the generation of test patterns and allows a more simplified control of the input to characterization register 214.

Figure 4:
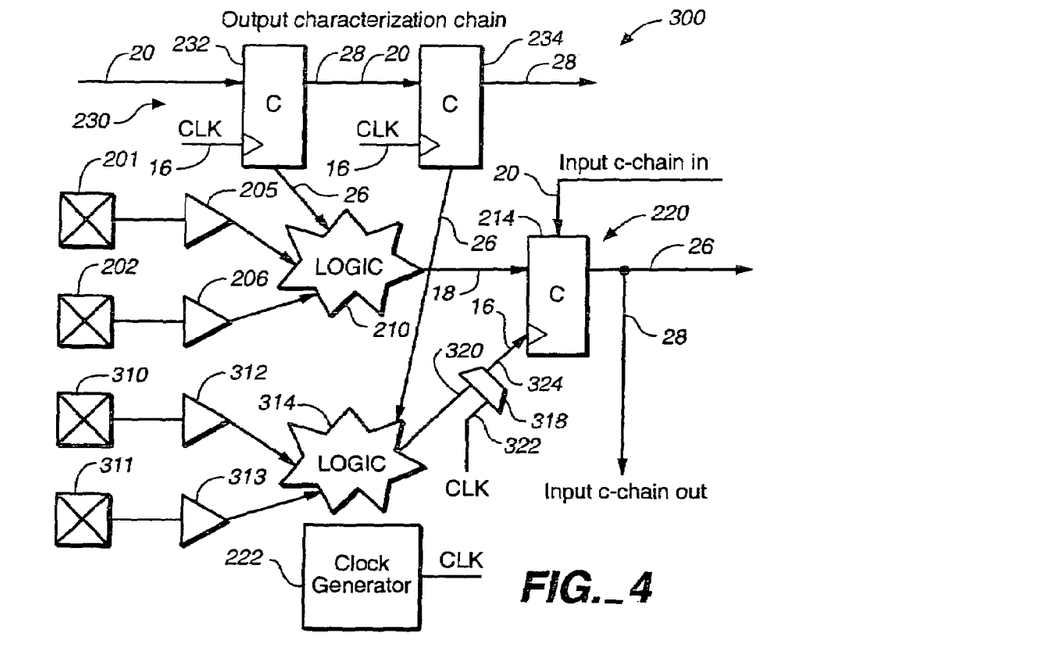
FIG. 4 is a schematic diagram illustrating a portion of an integrated circuit having an externally-clocked input characterization chain according to another embodiment of the present invention.

In the example shown in FIG. 3, input characterization registers 214 and 216 are internally clock registers since those registers are clocked by a clock signal CLK that is generated on the integrated circuit. FIG. 4 is a schematic diagram illustrating a portion of an integrated circuit 300 having an externally-clocked input register according to one embodiment of the present invention. The same reference numerals are used in FIG. 4 as were used in FIG. 3 for the same or similar elements. For simplicity, input pin 203, input buffer 207, logic circuit 212 and input characterization register 216 are not shown.

In the example shown in FIG. 4, clock input 16 of input characterization register 214 is not clocked by the internal clock signal CLK during normal operation. Rather, it is clocked by external signals applied to input pins 310 and 311, which are coupled to input buffers 312 and 313 and logic circuit 314. The output of logic 314 is coupled to a first data input 320 of multiplexer 318. Clock signal CLK is coupled to a second data input 322 of multiplexer 318. Output 324 of multiplexer 318 is coupled to clock input 16 of input characterization register 214.

With this configuration, clock input 16 on input characterization register 214 is multiplexed. For the normal operating mode and the latch value operating mode, the clock signal comes from input pins 310 and 311. For the shift chain mode, the internal clock signal CLK is used.

Figure 5:
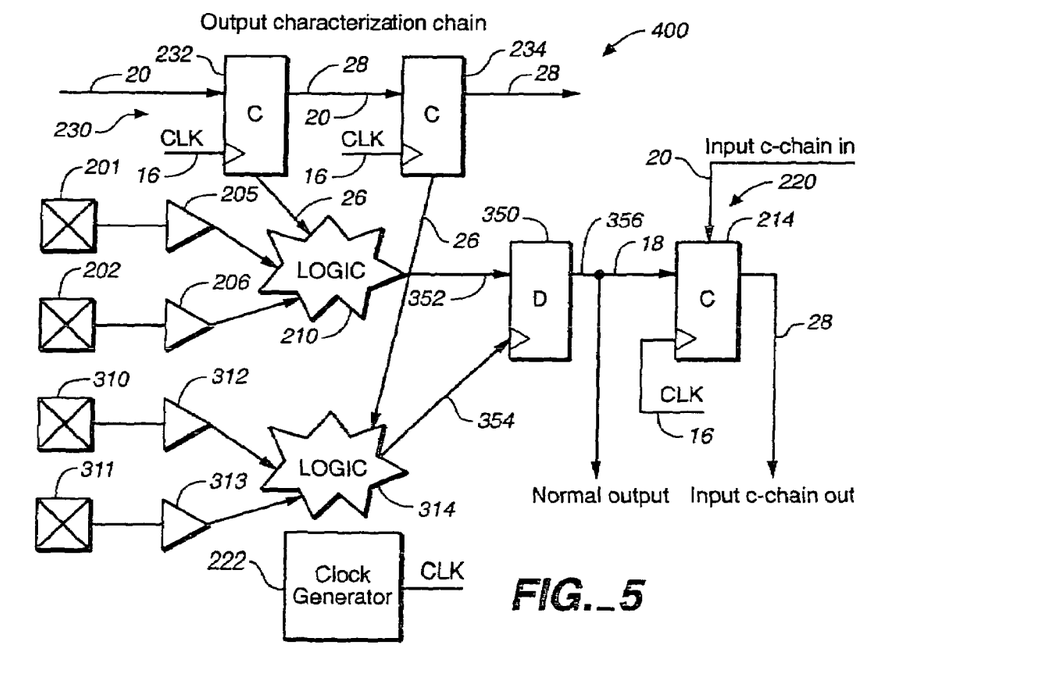
FIG. 5 is a schematic diagram illustrating a portion of an integrated circuit having an externally-clocked input register and an internally-clocked input characterization chain according to another embodiment of the present invention.

FIG. 5 is a schematic diagram of an integrated circuit 400 having an externally-clocked input register and an internally-clocked input characterization chain. Again, the same reference numerals are used in FIG. 5 as were used in FIGS. 3 and 4 for the same or similar elements. In this embodiment, a traditional input register 350 is used to register the input signal from logic circuit 210. Input register 350 can include a D-type flip-flop for example. Register 350 has a data input 352 coupled to the output of logic circuit 310, a clock input 354 coupled to the output of logic circuit 314 and a data output 356 coupled to the normal data input 18 of input characterization register 214. Normal data output 356 would also be coupled to the core logic elements (not shown) that would normally receive the data through input register 350. Input register 350 remains clocked by an external logic signal, and input characterization register 214 is clocked by internal clock signal CLK in each of the three operating modes. This adds a latch to the design path but makes it simpler to test and does not make any changes to the clock coming in to the design.

By using I/O characterization registers as shown in the above-embodiments, I/O characterization can be performed in two phases. Outputs can be checked with one test, and inputs can be checked with another test. For the input test, bi-directional outputs can be forced to the high impedance state by using a high-impedance test pin on the integrated circuit or by providing the necessary values to an output characterization chain that drives the bi-directional outputs. The combination of these two tests should allow for complete characterization of bi-directional outputs. Outputs from analog circuitry can also be connected to an output characterization chain like any other output on an integrated circuit. Any value or transition between values can be tested.

The I/O characterization registers can be controlled in any suitable fashion. For example, the registers can be coupled to test pins on the integrated circuit such that they can be controlled by external control circuitry. Alternatively, a hardware built-in self-test (BIST) circuit on the integrated circuit can be used for toggling output pins through the output characterization chains. However, internal BIST circuits may not work well for controlling input characterization chains while testing inputs. Another method of controlling the I/O characterization chains is to use a central chip controller and a global bus, which is connected to each of the I/O characterization registers. The controller could easily write patterns and send control signals to each chain for toggling the outputs and reading the inputs. With a central controller, individual chains do not need to be connected together. Smaller chains are easier to control, and the characterization patterns become very modular.

The I/O characterization registers of the present invention can easily be used with multiple clock domains. Multiple clock domains can be handled with multiple characterization chains or, the boundaries between the clock domains can be handled with special circuitry.

Once characterization chains have been inserted into an integrated circuit design, creating test patterns becomes relatively easy. A pseudo-random pattern, for example, sent through an output chain would probably characterize most outputs accurately. The module designer would need to specify a set of values for input characterization set up. Once this is done, a pseudo-random pattern of inputs would probably characterize most inputs accurately.

With characterization chains similar to those shown in the above figures, all I/Os can be characterized easily. The resulting characterization vectors can be made much shorter than corresponding functional vectors. All I/Os are characterized with the same technology. Tester set up for I/Os using this methodology is always the same so that testing can be made much easier for the test engineer. Adding new modules and I/O to a chip is relatively easy, and characterized modules can be easily used in other designs. In addition, module designers are less likely to create untestable pins if they follow this methodology.

Although the present invention has been described with reference to preferred embodiments, workers skilled in the art will recognize that changes may be made in form and detail without departing from the spirit and scope of the invention. In addition, the term "coupled" used in the specification and the claims can include a direct connection and a connection through one or more intermediate components.

What is claimed is:

1. A characterization register for characterizing an integrated circuit input or output, the register comprising:
   a data latch having a latch control input, a latch data input and a latch data output; and
   a normal data input and a characterization data input, which are multiplexed with the latch data output to the latch data input;
   a characterization shift enable input and a scan shift enable input, wherein the characterization data input and the latch data output are multiplexed to a characterization data node as a function of the characterization shift enable input and the scan shift enable input; and
   a characterization select input, wherein the characterization data node and the normal data input are multiplexed to the latch data input as a function of the characterization select input and the scan shift enable input.

2. The characterization register of claim 1 and further comprising:
   a first multiplexer having a first input coupled to the latch data output, a second input coupled to the characterization data input, an output coupled to the characterization data node and a control input coupled to the characterization shift enable input and the scan shift enable input; and
   a second multiplexer having a first input coupled to the normal data input, a second input coupled to the characterization data node, an output coupled to the latch data input and a control input coupled to the characterization select input and the scan select input.

3. An output characterization circuit for characterizing timing characteristics of an integrated circuit output, the circuit comprising:
   a first output pin;
   a first logic circuit on the integrated circuit; and
   a first plurality of characterization registers, wherein each register comprises a normal data input, a characterization data input, and a data latch having a latch control input, a latch data input and a latch data output which drives the first output pin through the first logic circuit, wherein the normal data input and the characterization data input are multiplexed with the latch data output to the latch data input, and wherein the first plurality of registers are coupled in a chain, with the latch data output of each register being coupled to the characterization data input of the next register in the chain.

4. The output characterization circuit of claim 3 wherein each characterization register further comprises:
   a characterization shift enable input, wherein the characterization data input and the latch data output of that register are multiplexed to a characterization data node of that register as a function of the characterization shift enable input;
   a characterization select input, wherein the characterization data node and the normal data input of that register are multiplexed to the latch data input as a function of the characterization select input of that register; and
   wherein the characterization shift enable inputs of the first plurality of characterization registers are coupled to one another and the characterization select inputs of the first plurality of characterization registers are coupled to one another.

5. The output characterization circuit of claim 4 wherein each characterization register further comprises:
   a first multiplexer having a first input coupled to the latch data output, a second input coupled to the characterization data input, an output coupled to the characterization data node and a control input coupled to the characterization shift enable input; and
   a second multiplexer having a first input coupled to the normal data input, a second input coupled to the characterization data node, an output coupled to the latch data input and a control input coupled to the characterization select input.

6. The output characterization, circuit of claim 3 and further comprising:
   a plurality of spacing registers, wherein each spacing register is coupled in the chain between the latch data output of a respective one of the characterization registers and the characterization data input of a respective next characterization register in the chain and do not drive the first output pin.

7. The output characterization circuit of claim 6 and further comprising:
   a second output pin;
   a second logic circuit; and
   a second plurality of characterization registers formed by the plurality of spacing registers, wherein each of the second plurality of characterization registers comprises a normal data input, a characterization data input, and a data latch having a latch control input, a latch data input and a latch data output which drives the second output pin through the second logic circuit, wherein the normal data input and the characterization data input of that register are multiplexed with the latch data output of that register to the latch data input of that register, wherein the latch data output of each of the second plurality of registers is coupled to the characterization data input of the next subsequent one of the first plurality of registers in the chain, and wherein the characterization data input of each of the second plurality of registers is coupled to the latch data output of the next previous one of the first plurality of registers in the chain.

8. The output characterization circuit of claim 3 wherein the first plurality of characterization registers comprises every register in the integrated circuit that drives the first output pin.

9. A method of characterizing inputs to an integrated circuit, the circuit comprising:
   storing values in a plurality of input characterization registers on the integrated circuit as a result of an input test pattern applied to inputs pins of the integrated circuit, wherein each input characterization register comprises a normal data input, which has a direct path from one or more of the input pins to the normal data input, a characterization data input, and a data latch having a latch control input, a latch data input and a latch data output, wherein the normal data input and the characterization data input are multiplexed with the latch data output to the latch data input;
   serially shifting the values out of a chain formed by the plurality of input characterization registers, wherein the latch data output of each characterization register is coupled to the characterization data input of a next one of the input characterization registers in the chain; and characterizing at least one of a set up time and a hold time for each input pin based on the values.

10. The method of claim 9 and further comprising:

multiplexing the characterization data input and the latch data output to a characterization data node as a function of a characterization shift enable input; and multiplexing the characterization data node and the normal data input to the latch data input as a function of a characterization select input.

11. The method of claim 10 wherein each input characterization register further comprises:

a first multiplexer having a first input coupled to the latch data output, a second input coupled to the characterization data input, an output coupled to the characterization data node and a control input coupled to the characterization shift enable input; and a second multiplexer having a first input coupled to the normal data input, a second input coupled to the characterization data node, an output coupled to the latch data input and a control input coupled to the characterization select input.

12. The method of claim 9 and further comprising:

generating an internal clock with a clock generator on the integrated circuit, which has an internal clock output that is coupled directly to the latch control input of each of the input characterization registers in the chain.

13. The method of claim 9 and further comprising:

providing a clock input pin to the integrated circuit;

generating an internal clock with a clock generator on the integrated circuit, which has an internal clock output; and multiplexing the clock input pin and the internal clock output to the latch control inputs of the input characterization registers.

14. The method claim 9 and further comprising:

providing a clock input pin to the integrated circuit;

generating an internal clock with a clock generator on the integrated circuit, which has an internal clock output coupled to the latch control input of the input characterization registers; and providing a normal data register comprising a data input which is driven by one or more of the input pins through a logic circuit, a data output which is coupled to the normal data input of one of the input characterization registers, and a clock input which is coupled to the clock input pin.

* * * * *